United States Patent [19]
Ogawara

[11] 3,956,668
[45] May 11, 1976

[54] VERTICAL DEFLECTION CIRCUIT

[75] Inventor: Yoshiaki Ogawara, Inagi, Japan

[73] Assignee: Sony Corporation, Tokyo, Japan

[22] Filed: Dec. 17, 1974

[21] Appl. No.: 533,550

[30] Foreign Application Priority Data
Dec. 27, 1973 Japan.................................. 49-4187

[52] U.S. Cl.............................. 315/370; 315/388; 315/408
[51] Int. Cl.² ......................................... H01J 29/70
[58] Field of Search ........... 315/370, 387, 388, 403, 315/408, 409

[56] References Cited
UNITED STATES PATENTS

| | | | |
|---|---|---|---|
| 3,247,419 | 4/1966 | Attwood.............................. | 315/403 |
| 3,543,080 | 11/1970 | Wuensch ............................ | 315/371 |
| 3,760,221 | 9/1973 | Yoshikawa et al. ............. | 315/403 X |
| 3,794,877 | 2/1974 | Smith et al.......................... | 315/403 |

*Primary Examiner*—T. H. Tubbesing
*Attorney, Agent, or Firm*—Lewis H. Eslinger; Alvin Sinderbrand

[57] ABSTRACT

A vertical deflection circuit including a Miller integrator and a Schmitt trigger circuit in combination to obtain a sawtooth wave signal at an output terminal of the Miller integrator circuit and a vertical deflection coil connected to the output terminal of the Miller integrator circuit to be supplied with the sawtooth wave signal therefrom in which the Schmitt trigger circuit is controlled by a vertical pulse signal for synchronization and the Miller integrator circuit is preferably controlled by a parabolic wave signal of the vertical scanning rate in order to compensate for or correct the non-linearity in the vertical deflection. The circuit configuration is well suited for being formed as an integrated circuit on a single semiconductor substrate.

4 Claims, 6 Drawing Figures

Fig. 1
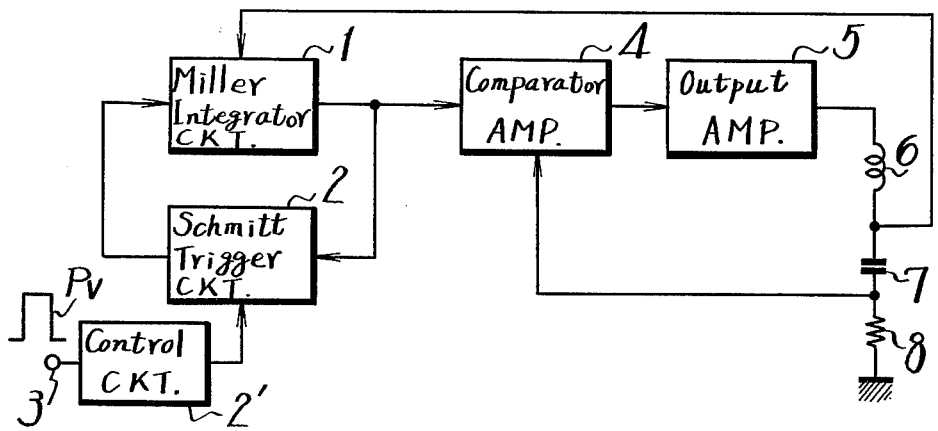
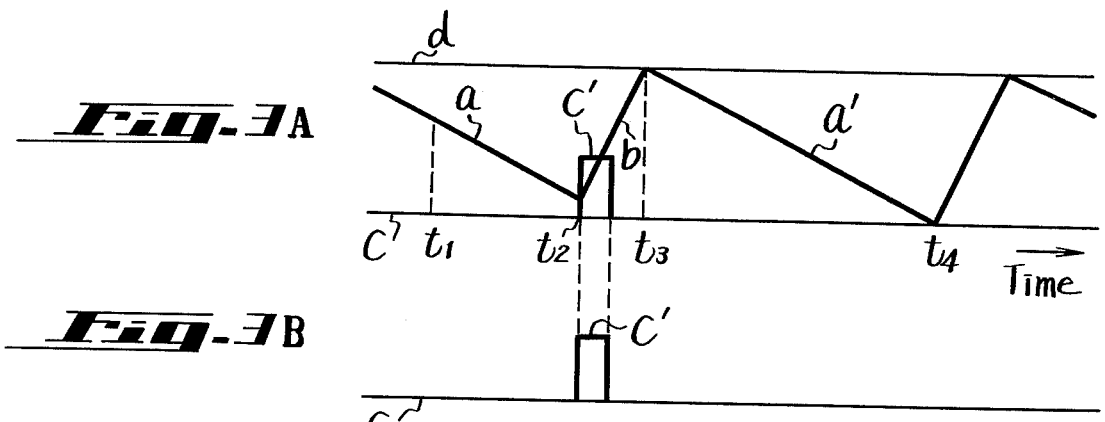
Fig. 3A
Fig. 3B
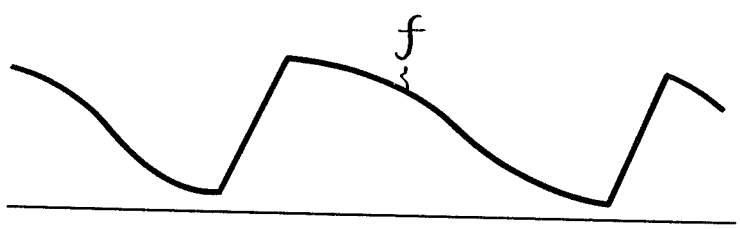
Fig. 3C
Fig. 3D

VERTICAL DEFLECTION CIRCUIT

BACKGROUND OF THE INVENTION

1. Field of the Invention

This invention relates generally to a vertical deflection circuit, and more particularly to such a circuit having a superior characteristic and well suited for being formed as an integrated circuit on a single semiconductor wafer or substrate.

2. Description of the Prior Art

In television receivers, for example, many circuits, such as, intermediate frequency (IF) amplifiers, luminance amplifiers, chrominance amplifiers and the like have been devised to be formed as an integrated circuit on a single semiconductor wafer or substrate, either alone or together with other circuits.

Thinking of vertical deflection circuits, a lot of efforts have also been made to form the circuits as an integrated circuit on a single semiconductor substrate and several circuit configurations have been devised which are suitable for such a purpose.

However, in conventional vertical deflection circuits, a lot of external terminals should be provided on a semiconductor substrate when the circuits are formed as the integrated circuit on the semiconductor substrate, because several capacitors should be connected externally such as for a vertical oscillator, for compensation for non-linearity in beam deflection and so on and transistor circuits included in the conventional circuits are often obliged to be coupled to each other using external capacitors.

And further, in conventional vertical deflection circuits an externally adjustable circuit usually should be provided for linearity compensation for beam deflection in order to achieve the compensation operation symmetrically.

OBJECTS OF THE INVENTION

Accordingly, it is an object of the invention to provide an improved and novel vertical deflection circuit avoiding disadvantages inherent in the prior art.

Another object of the invention is to provide an improved vertical deflection circuit well suited for being formed as an integrated circuit on a single semiconductor substrate.

A further object of this invention is to provide a novel vertical deflection circuit in which a symmetrically operating linearity compensation circuit is provided and any adjustable circuit for the compensation need not be provided.

SUMMARY OF THE INVENTION

A vertical deflection circuit according to the invention includes a Miller integrator circuit and a Schmitt trigger circuit in combination to obtain a sawtooth wave at an output terminal of the Miller integrator circuit.

The Miller integrator circuit includes an amplifier and a capacitor connected between input and output terminals of the amplifier, and charging and discharging circuits are respectively associated with the capacitor of the Miller integrator circuit. An output terminal of the Miller integrator circuit is connected to an input terminal of the Schmitt trigger circuit and an output terminal of the Schmitt trigger circuit is connected to the discharging circuit associated with the capacitor of the Miller integrator circuit.

In such a construction, the Schmitt trigger circuit is synchronized with a vertical pulse signal and a vertical sawtooth wave signal is obtained at the output terminal of the Miller integrator circuit and this sawtooth wave signal is supplied to a vertical deflection coil connected to the Miller integrator circuit.

The Miller integrate circuit, the Schmitt trigger circuit, the control circuit and some other circuits are direct current conductively connected to one another and most of the circuits except the capacitor of the Miller integrator circuit are formed as an integrated circuit on a single semiconductor substrate.

The vertical deflection circuit of the invention preferably includes a parabolic wave signal source of the vertical scanning rate and this signal is applied to the charging circuit associated with the capacitor of the Miller integrator circuit in order to compensate for or correct non-linearity in the vertical deflection, so that the operation of the non-linearity compensation becomes symmetrical and any adjustable circuit need not be provided for such compensation.

The above, and other objects, features and advantages of the invention will be apparent in the following detailed description of an illustrative embodiment thereof which is to be read in connection with the accompanying drawings.

BRIEF DESCRIPTION OF THE DRAWINGS

FIG. 1 is a block diagram of a vertical deflection circuit according to the invention.

FIGS. 3A – 3D are waveform diagrams respectively to be used for explaying the operation of the circuit of FIG. 2.

DESCRIPTION OF THE PREFERRED EMBODIMENT

Figure 2:
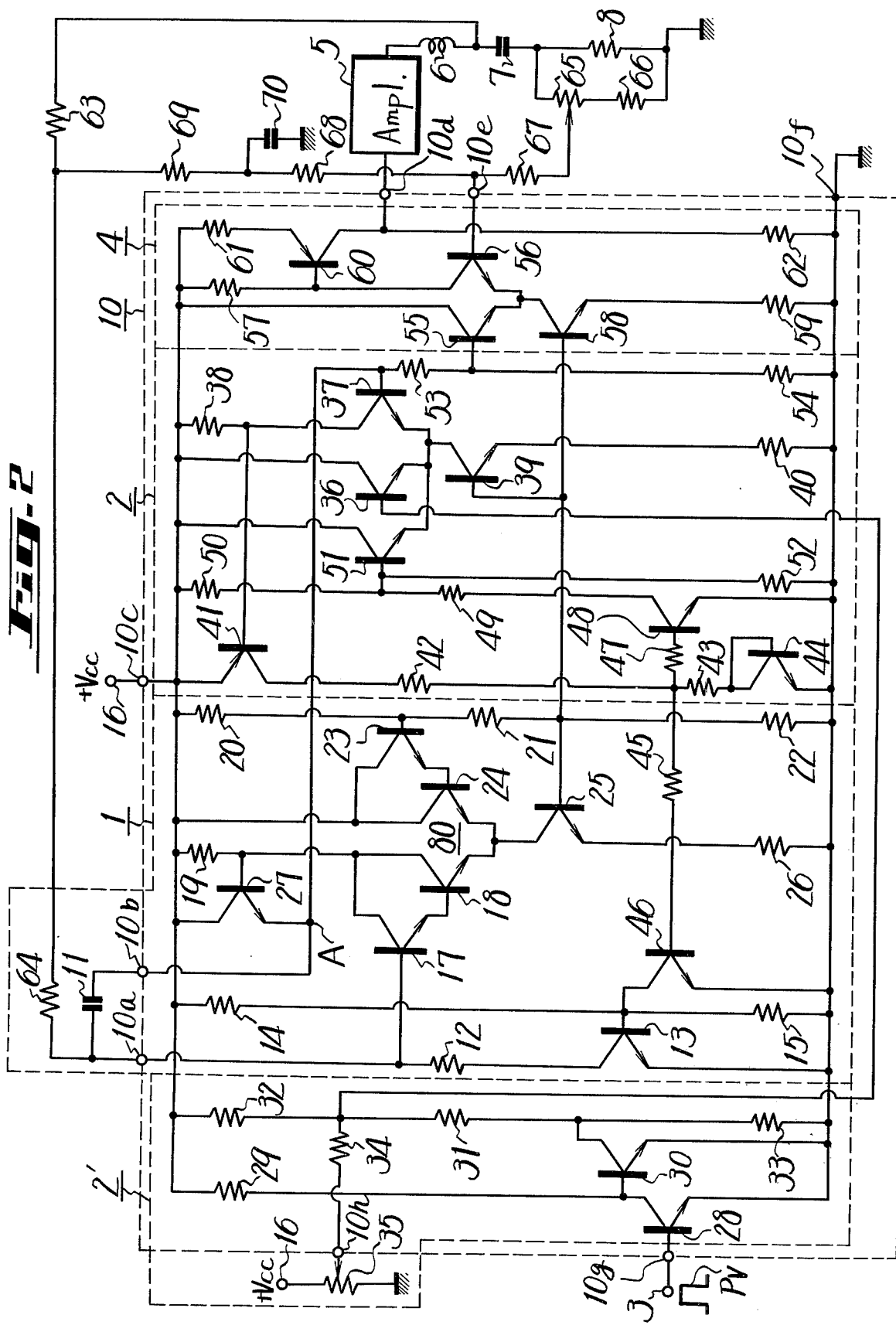
FIG. 2 is a circuit diagram of a vertical deflection circuit according to one embodiment of the invention.

FIG. 1 is a block diagram showing an embodiment of the vertical deflection circuit of the present invention. In FIG. 1, reference numeral 1 designates a Miller integrator circuit whose output signal is applied to one input terminal of a Schmitt trigger circuit 2. A vertical pulse signal $P_V$ applied to an input terminal 3 is applied through a control circuit 2' to the other input terminal of the Schmitt trigger circuit 2 whose output signal is fed back to the Miller integrator circuit 1. Thus, a sawtooth wave signal synchronized with the vertical pulse signal $P_V$ is obtained at the output terminal of the Miller integrator circuit 1. The sawtooth wave signal is then applied to a comparator amplifier circuit 4 whose output signal is applied to an output amplifier circuit 5. An output signal from the output amplifier circuit 5 is applied to a vertical deflection coil 6 at its one end. The other end of the vertical deflection coil 6 is grounded through a series connection of a capacitor 7 and a resistor 8. At the connection point between the vertical deflection coil 6 and the capacitor 7, there is obtained a parabolic wave signal of a vertical scanning rate which is applied to the Miller integrator circuit 1, and at the connection point between the capacitor 7 and the resistor 8 there is obtained a sawtooth wave voltage which is proportional to a current passing through the vertical deflection coil 6 and this sawtooth wave voltage is applied to the comparator amplifier circuit 4.

The vertical deflection circuit according to the invention is formed as mentioned above in connection with FIG. 1, and is well suited for being formed on a single semiconductor wafer as an integrated circuit and further the circuit is superior in linearity, which will be described in detail hereinafter.

FIG. 2 is a connection diagram showing a practical embodiment of the vertical deflection circuit shown in FIG. 1 as a block diagram, in which like reference numerals are used to designate the corresponding elements in FIG. 1.

In FIG. 2, reference numeral 10 generally indicates a single semiconductor substrate on which the Miller integrator circuit 1, the Schmitt trigger circuit 2, the control circuit 2' and the comparator amplifier circuit 4 as mentioned above are formed as an integrated circuit. The substrate 10 is provided with eight terminals $10_a$, $10_b$, ... $10_h$ for external connections.

In the embodiment of FIG. 2, the Miller integrator circuit 1 is formed of a capacitor 11, resistors 12, 14, 15, 19, 20, 21, 22, 26, 45 and 64, and transistors 13, 17, 18, 23, 24, 25, 27 and 46. The resistors 19, 20, 21, 22 and 26 and the transistors 17, 18, 23, 24, 25 and 27 form a differential amplifier circuit 80 in the Miller integrator circuit 1.

The capacitor 11 is an essential element to form the Miller integrator circuit 1 together with the differential amplifier circuit 80. This capacitor 11 is connected externally between the terminals $10_a$ and $10_b$ of the substrate 10. The terminal $10_a$ is connected through the resistor 12 to the collector electrode of the transistor 13 which is of NPN-type. The emitter electrode of the transistor 13 is connected to the terminal $10_f$ of the substrate 10 and the terminal $10_f$ is grounded. The base electrode of the transistor 13 is connected through the resistors 14 and 15 to the terminals $10_c$ and $10_f$, respectively. The terminal $10_c$ is, in turn, connected to a voltage supply terminal 16 of $+V_{CC}$ which is supplied with a DC voltage of, for example, +12 volts. The connection point between the terminal $10_a$ and the resistor 12 is connected to the base electrode of the transistor 17, which is of NPN-type, whose emitter electrode is connected to the base electrode of the transistor 18, which is also of NPN-type. The collector electrode of the transistor 17 is connected to that of the transistor 18. The connection point between the collector electrodes of the transistors 17 and 18 is connected through the resistor 19 to the terminal $10_c$. The series connection of the resistors 20, 21 and 22 is connected between the terminals $10_c$ and $10_f$, and the connection point between the resistors 20 and 21 is connected to the base electrode of the transistor 23 which is of NPN-type. The emitter electrode of the transistor 23 is connected to the base electrode of the transistor 24 which is of NPN-type, and the collector electrode of the former is connected to the collector electrode of the latter, whose connection point is connected to the terminal $10_c$. The emitter electrodes of the transistors 18 and 24 are connected together and then connected to the collector electrode of the transistor 25 which is of NPN-type. The base electrode of the transistor 25 is connected to the connection point between the resistors 21 and 22. The emitter electrode of the transistor 25 is connected through the resistor 26 to the terminal $10_f$. The connection point among the resistor 19 and the collector electrodes of the transistors 17 and 18 is connected to the base electrode of the transistor 27 which is of NPN-type, the collector electrode thereof is connected to the terminal $10_c$ and the emitter electrode thereof is connected to the terminal $10_b$.

The control circuit 2' is formed of resistors 29, 31, 32, 33 and 34, a variable resistor 35 and transistors 28 and 30. The terminal $10_g$ is connected to the base electrode of the transistor 28 which is of NPN-type and also to the input terminal 3 which is supplied with the vertical pulse signal $P_V$ as mentioned previously. The emitter electrode of the transistor 28 is connected to the terminal $10_f$ and its collector electrode is connected through the resistor 29 to the terminal $10_c$ and also to the base electrode of the transistor 30 which is of NPN-type. The emitter electrode of the transistor 30 is connected to the terminal $10_f$ and the collector electrode thereof is connected through the series connection of the resistors 31 and 32 to the terminal $10_c$ and also to the terminal $10_f$ through the resistor 33. The connection point between the resistors 31 and 32 is connected through the resistor 34 to the terminal $10_h$ which is connected to the movable tap of the variable resistor 35 connected between the voltage supply terminal 16 and the ground.

The Schmitt trigger circuit 2 is formed of resistors 38, 40, 42, 43, 47, 49, 50, 52, 53 and 54 and transistors 36, 37, 39, 41, 44, 48 and 51. The connection point between the resistors 31 and 32 of the control circuit 2' is DC-coupled to the base electrode of the transistor 36, which is of NPN-type, in the Schmitt trigger circuit 2. The collector electrode of the transistor 36 is connected to the terminal $10_c$. The terminal $10_b$ is DC-coupled to the base electrode of the transistor 37 which is of NPN-type. The collector electrode of the transistor 37 is connected through the resistor 38 to the terminal $10_c$. The emitter electrodes of the transistors 36 and 37 are connected together to the collector electrode of the transistor 39 which is of NPN-type whose base electrode is DC-coupled to the connection point between the resistors 21 and 22 of the Miller integrator circuit 1. The emitter electrode of the transistor 39 is connected through the resistor 40 to the terminal $10_f$. The connection point between the collector electrode of the transistor 37 and the resistor 38 is connected to the base electrode of the transistor 41 which is of PNP-type whose emitter electrode is connected to the terminal $10_c$ and whose collector electrode is connected through the series connection of the resistors 42 and 43 to the collector electrode of the transistor 44 which is of NPN-type. The emitter electrode of the transistor 44 is connected to the terminal $10_f$ and the collector and base electrodes thereof are connected together. The connection point between the resistors 42 and 43 is DC-coupled to the base electrode of the transistor 46 which is of NPN-type through the resistor 45 in the Miller integrator circuit 1. The collector electrode of the transistor 46 is connected to the base electrode of the transistor 13 and the emitter electrode of the former is connected to the terminal $10_f$. The connection point between the resistors 42 and 43 is also connected to the base electrode of the transistor 48 which is of NPN-type through the resistor 47. The collector electrode of the transistor 48 is connected through the series connection of the resistors 49 and 50 to the terminal $10_c$ and the emitter electrode thereof is connected to the terminal $10_f$. The connection point between the resistors 49 and 50 is connected to the base electrode of the transistor 51 which is of NPN-type and also to the terminal $10_f$ through the resistor 52. The collector electrode of the transistor 51 is connected to the terminal $10_c$ and its emitter electrode is connected to the connection point between the emitter electrodes of the transistors 36 and 37. The connection point between the terminal $10_b$ and the base electrode of the transistor 37 is connected through the series connection of the resistors 53 and 54 to the terminal $10_f$.

The comparator amplifier circuit 4 is formed of resistors 57, 59, 61 and 62 and transistors 55, 56, 58 and 60. The connection point between the resistors 53 and 54 of the Schmitt Trigger circuit 2 is DC-coupled to the base electrode of the transistor 55 which is of NPN-type of the comparator amplifier circuit 4. The collector electrode of the transistor 55 is connected to the terminal $10_c$. The collector electrode of the transistor 56 which is of NPN-type is connected through the resistor 57 to the terminal $10_c$. The emitter electrodes of the transistors 55 and 56 are connected together to the collector electrode of the transistor 58 which is of NPN-type whose base electrode is DC-coupled to the connection point between the resistors 21 and 22 of the Miller integrator circuit 1. The emitter electrode of the transistor 58 is connected through the resistor 59 to the terminal $10_f$. The connection point between the collector electrode of the transistor 56 and the resistor 57 is connected to the base electrode of the transistor 60 which is of PNP-type whose emitter electrode is connected through the resistor 61 to the terminal $10_c$ and whose collector electrode is connected through the resistor 62 to the terminal $10_f$. The connection point between the collector electrode of the transistor 60 and the resistor 62 is connected to the terminal $10_d$ and this terminal $10_d$ is DC-coupled to an output amplifier circuit 5 which is provided outside of the IC substrate 10. It is, however, to be understood that the output amplifier circuit 5 can be formed on the substrate 10 together with the circuits 1, 2, 2' and 4. The output terminal of the output amplifier circuit 5 is connected to one end of the vertical deflection coil 6 whose other end is grounded through the series connection of the capacitor 7 and the resistor 8. The connection point between the vertical deflection coil 6 and the capacitor 7 is connected through a series connection of resistors 63 and 64 to the connection point between the terminal $10_a$ and the capacitor 11 of the Miller integrator circuit 1. A series connection of a variable resistor 65 and a resistor 66 is connected in parallel with the resistor 8. The movable tap of the variable resistor 65 is connected through a resistor 67 to the terminal $10_e$ which is connected to the base electrode of the transistor 56 in the comparator amplifier circuit 4. The connection point between the terminal $10_e$ and the resistor 67 is connected through a series circuit of resistors 68 and 69 to the connection point between the resistors 63 and 64. The connection point between the resistors 68 and 69 is grounded through a capacitor 70.

A description will be now given on the operation of the circuit shown in FIG. 2. During the vertical tracing period, the transistor 37 of the Schmitt trigger circuit 2 is held conductive but the transistors 36 and 51 are held nonconductive. When the transistor 37 is conductive, the transistor 41 and hence the transistors 44, 46 and 48 are made conductive. Since the transistor 46 is conductive during the vertical tracing period, the transistor 13 is non-conductive and the capacitor 11 of the Miller integrator circuit 1 is charged by the current passing through the resistor 64. The charging operation of the capacitor 11 is achieved by the amplifying operation of the differential amplifier 80 linearly. Thus, at the connection point A between the terminal $10_b$ and the emitter electrode of the transistor 27, there is obtained a voltage which gradually decreases as shown by a curve $a$ in FIG. 3A. The voltage obtained at the connection point A is applied to the base electrode of the transistor 37 in the Schmitt trigger circuit 2.

The operation of the circuit shown in FIG. 2 is now considered at a time $t_1$ in the vertical tracing period. At that time, since the transistor 48 is conductive, the resistor 49 is connected in parallel to the resistor 52 and as a result, the voltage at the base electrode of the transistor 51 becomes low. On the other hand, since, at the time $t_1$, the transistor 28 in the control circuit 2' is non-conductive and the transistor 30 is conductive, the voltage at the connection point between the resistors 32 and 31 or the base voltage of the transistor 36 is made also low, because the resistor 33 is short-circuited by the transistor 30. In this case the resistance values of the resistors 31, 32, 34, 49, 50 and 52 are so selected that during the vertical tracing period the base voltage of the transistor 36 becomes higher than that of the transistor 51. The base voltage of the transistor 36 has the level shown by a line C in FIG. 3B during the vertical tracing period. While, during the period within which the vertical pulse signal $P_V$ is applied to the base electrode of the transistor 28, the transistors 28 and 30 are made conductive and non-conductive, respectively, and the resistor 33 is inserted, so that the base voltage of the transistor 36 becomes to such a level shown by a line $c'$ in FIG. 3B which is higher than that shown by the curve $c$. Accordingly, when the voltage applied to the base electrode of the transistor 37 from the circuit point A in the Miller integrator circuit 1 is decreased gradually and becomes lower than the level as shown by the line $c'$ in FIG. 3A at a time $t_2$, and when the vertical pulse signal $P_V$ is applied to the base electrode of the transistor 28 and hence the base voltage of the transistor 36 is raised from the level shown by the curve $c$ to that shown by the curve $c'$ at the time $t_2$, the transistor 37 is made non-conductive while the transistor 36 is made conductive. When the transistors 36 and 37 are made conductive and non-conductive, respectively, at the time $t_2$, the transistor 41 is made non-conductive, and therefore the transistors 44, 46 and 48 are made non-conductive, respectively. When the transistor 48 is made non-conductive, the resistor 49 is disconnected and as a result, the base potential of the transistor 51 is raised to a level shown by a line $d$ in FIG. 3A, so that the transistor 51 is made conductive and the transistor 36 is made non-conductive.

On the other hand, since at the time $t_2$ the transistor 46 is made non-conductive, the transistor 13 is made conductive. Thus, the resistor 12 is made to be connected between the base electrode of the transistor 17 and the terminal $10_f$ and hence a current is started to flow through the resistor 12. Since the resistance value of the resistor 12 is selected small, the current passing through the resistor 12 becomes sufficiently greater than that passing through the resistor 64. Therefore, the capacitor 11 is discharged through the resistor 12, so that the potential at the circuit point A or the base voltage of the transistor 37 increases as shown by a line $b$ in FIG. 3A. As also shown in FIG. 3A, this base voltage of the transistor 37 arrives at a voltage level shown by the line $d$ or the base voltage of the transistor 51 at a time $t_3$, and consequently the transistor 37 is made conductive and the transistor 51 is made non-conductive at that time. When the transistor 37 is made conductive at the time $t_3$, the transistor 41 is made conductive and therefore the transistors 44, 46 and 48 are made also conductive. In FIG. 3A, the period between the time $t_2$ and $t_3$ represents a vertical retracing period.

When the transistor 46 is made conductive at the time $t_3$, the transistor 13 is made non-conductive and hence the resistor 12 is disconnected. Therefore, the capacitor 11 is again charged with the current flowing through the resistor 64. As a result, the voltage at the circuit point A or the base voltage of the transistor 37 is again decreased gradually, as shown in FIG. 3A by a curve $a'$, and hence another vertical tracing period starts.

Since, at the time $t_3$, the transistor 48 is made conductive and the resistor 49 is inserted in parallel with the resistor 52, the base voltage of the transistor 51 is lowered from the level shown by the line $d$ in FIG. 3A to a level lower than that shown by the line $c$ or the base voltage of the transistor 51 is made lower than the base voltage of the transistor 36.

The above described operation will be repeated and a sawtooth wave signal in synchronism with the vertical pulse signal $P_V$ is produced at the circuit point A.

Assuming that the input terminal 3 is not supplied with the vertical pulse signal $P_V$, the transistors 28 and 30 are made always non-conductive and conductive, respectively, and the base voltage of the transistor 36 is maintained at the voltage shown by the line $c$, so that the period between the times $t_3$ and $t_4$ as shown in FIG. 3A becomes a new vertical tracing period. That is, even when the vertical pulse signal $P_V$ is not applied to the input terminal 3, a sawtooth signal restricted by an upper level represent by the line $d$ and a lower level represented by the line $c$ is obtained at the circuit point A. Therefore, even in the case where, for example, several pulses of the vertical pulse signal $P_V$ disappear accidentally in a signal transmission line, the sawtooth wave signal obtained at the circuit point A is not disturbed so much relative to the synchronization with the vertical pulse signal $P_V$.

Further, the voltage level represented by the line $c$ in FIG. 3A can be varied by changing the variable resistor 35 in the control circuit 2'.

The above mentioned sawtooth wave signal obtained at the circuit point A is applied through the voltage divider formed of the resistors 53 and 54 to the base electrode of the transistor 55 in the comparator amplifier circuit 4 as an input sawtooth wave signal or a reference voltage signal. On the other hand, an output sawtooth voltage signal obtained across the resistor 8, which corresponds to the vertical deflection current flowing through the deflection coil 6, is level-adjusted by the variable resistor 65 and then supplied to the base electrode of the transistor 56 in the comparator amplifier circuit 4. In the comparator amplifier circuit 4, the input sawtooth voltage signal or reference voltage signal, which is applied to the base electrode of the transistor 55, is compared with the output sawtooth voltage signal, which is applied to the base electrode of the transistor 56 and an error voltage signal of both the signals is obtained. This error voltage signal is applied through the output amplifier circuit 5 to the deflection coil 6, so that the waveform of the deflection current flowing through the deflection coil 6 is made to correspond to the waveform of the input sawtooth voltage signal applied to the base electrode of the transistor 55 or that of the sawtooth voltage signal obtained at the circuit point A with high accuracy.

In the circuit of FIG. 2, the voltage obtained at the connection point between the deflection coil 6 and the capacitor 7 is smoothed through the resistors 63, 69 and the capacitor 70 and then supplied to the transistor 56 as its DC bias voltage, and therefore the DC bias voltage for the output amplifier circuit 5 is stabilized.

Further, since the capacitor 7 integrates the sawtooth wave current flowing through the deflection coil 6, a parabolic wave signal $e$ as shown in FIG. 3C is obtained at the connection point between the deflection coil 6 and the capacitor 7. The level of the parabolic wave signal $e$ is selected by the resistors 63 and 69 and thereafter supplied through the resistor 64 to the capacitor 11 in the Miller integrator circuit 1. For this reason, the waveform of the Miller-integrated sawtooth wave signal obtained at the circuit point A or that of the deflection current flowing through the deflection coil 6 becomes a linearity compensated curve $f$ as shown in FIG. 3D. Thus, non-linearity in the vertical direction of a picture reproduced on the cathode ray tube of a television receiver can be compensated or corrected.

Further, in the present invention, as the capacitor 11 in the Miller integrator circuit 1 is controlled with the parabolic wave $e$ having the vertical scanning period, the waveform $f$ of the deflection current flowing through the deflection coil 6 becomes symmetrical with respect to a center line (not shown), as shown in FIG. 3D, and the non-linearity in the vertical direction of the picture reproduced on the cathode ray tube is corrected symmetrically at upper and lower sides of the cathode ray tube. Therefore, in the invention it is no need to provide an adjusting circuit for linearity correction.

As described above, with the vertical deflection circuit of the invention, all the Miller integrator circuit 1, the Schmitt trigger circuit 2, the control circuit 2', the comparator circuit 4 and the output amplifier circuit 5 are connected direct current conductively so that, except the capacitor 11 of the Miller integrator circuit 1, the other circuit elements can be formed, as an integrated circuit, on a single semiconductor substrate.

Further, in the invention since the capacitor 11 of the Miller integrator circuit 1 is controlled with the parabolic wave of the vertical scanning rate, the vertical linearity correction can be effectively carried out without any adjusting circuit.

It may be apparent that it is no need to limit the present invention to the above preferred embodiment but many modiffications and variations could be effected by one skilled in the art without departing from the spirits or scope of the novel concepts of the invention.

I claim as my invention:
1. A vertical deflection circuit comprising:
  A. a Miller integrator circuit including an amplifier having input and output terminals, and a capacitor connected between the input and output terminals of the amplifier;
  B. charging means connected to the capacitor of said Miller integrator circuit;
  C. discharging means connected to the capacitor of said Miller integrator circuit;
  D. a Schmitt trigger circuit having input and output terminals;
  E. means for connecting the output terminal of said Miller integrator circuit to the input terminal of said Schmitt trigger circuit;
  F. means for connecting the output terminal of said Schmitt trigger circuit to said discharging means;

G. control means connected to said Schmitt trigger circuit for supplying a vertical pulse signal thereto;

H. a vertical deflection coil; and

I. means for applying a signal obtained at the output terminal of said Miller integrator circuit to said vertical deflection coil.

2. A vertical deflection circuit according to claim 1, wherein said circuit further comprises:

1. a parabolic wave signal source of the vertical scanning rate; and 2. means connected to said signal source for applying the parabolic wave signal therefrom to said charging means in order to compensate for non-linearity in the vertical deflection.

3. A vertical deflection circuit according to claim 2, wherein at least a part of each of said Miller integrator circuit, said Schmitt trigger circuit and said control means are formed as an integrated circuit on a single semiconductor substrate.

4. A vertical deflection circuit according to claim 1, wherein said circuit further comprises:

1. a capacitor connected in series with said vertical deflection coil for deriving a parabolic wave signal of the vertical scanning rate at a connection point between the deflection coil and the capacitor; and 2. means for connecting said connection point to said Miller integrator circuit to apply the parabolic wave signal thereto.

* * * * *